US006232002B1

(12) United States Patent
Early et al.

(10) Patent No.: US 6,232,002 B1
(45) Date of Patent: May 15, 2001

(54) BILAYER ANTI-REFLECTIVE COATING AND ETCH HARD MASK

(75) Inventors: Kathleen R. Early, Santa Clara; Suzette K. Pangrle, Cupertino; Maria C. Chan, San Jose; Lewis Shen, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/186,920

(22) Filed: Nov. 6, 1998

(51) Int. Cl.$^{7}$ ..................................................... B32B 18/00

(52) U.S. Cl. .......................... 428/698; 428/450; 428/331; 430/5

(58) Field of Search .................................... 428/698, 446, 428/448, 689, 701, 702, 331; 430/5

(56) References Cited

U.S. PATENT DOCUMENTS 5,963,841 * 10/1999 Karlsson et al. ..................... 438/952
6,027,959 * 2/2000 En et al. .............................. 438/142
6,042,999 * 3/2000 Lin et al. ............................. 430/316

* cited by examiner

*Primary Examiner*—Deborah Jones
*Assistant Examiner*—Stephen Stein
(74) *Attorney, Agent, or Firm*—Mikio Ishimaru

(57) ABSTRACT

In the manufacture of sub 0.35 micron semiconductors using deep ultraviolet lithography, a bilayer of silicon dioxide on top of silicon oxynitride is used as bottom anti-reflective coating and an etch hard mask for photolithographic resist. Since the silicon dioxide is optically transparent at the deep ultraviolet wavelengths being used (248 nm), its thickness in combination with a preselected reflective silicon oxynitride thickness satisfies the zero reflectivity goal and, at the same time, is adequately thick to serve as a hard mask for self-aligned etch and self-aligned-source etch.

7 Claims, 2 Drawing Sheets

BILAYER ANTI-REFLECTIVE COATING AND ETCH HARD MASK

TECHNICAL FIELD

The present invention relates generally to an anti-reflective coating and an etch hard mask and more particularly to a semiconductor manufacturing process using the same.

BACKGROUND ART

As semiconductor devices have shrunk in size, deep ultraviolet (DUV) lithography has come into use for the manufacture of sub-0.35 micron line geometry semiconductor devices.

One problem with DUV lithography, as well as with conventional i-line lithography, is that the high reflectivity of polysilicon, metal, and poly/metal stacks have made small feature patterning and critical dimension (CD) control of photolithographic resist very difficult.

To solve this problem, different anti-reflective coatings (ARCs) have been developed which work by phase shift cancellation of specific wavelengths to provide uniform resist patterning. The ARCs are specifically designed so that the light reflected from the resist/ARC interface is equal in amplitude but opposite in phase to the light reflected from the ARC/reflective layer interface.

It has been found that there are certain line width variations which are due to the ARC not being able to reduce the reflective layer reflectivity to a minimum. The reflectivity causes problems with the resist which have been corrected in part by the use of bottom anti-reflective coatings (BARCs) underneath the resists. However, in some applications the BARC serves two purposes and must be of a certain thickness to serve as the hard mask for poly or metal etch while at the same time it must be of a predetermined thinness to minimize reflective layer reflectivity. In the past, the compromise thickness has been one which reduces, but does not minimize, reflectivity.

Silicon oxynitride by itself has been found to be a good BARC material. However, the thickness of silicon oxynitride required to perform the function of a good hard mask is too thick to minimize reflectivity.

In essence, the silicon oxynitride BARC serves two functions during semiconductor memory manufacturing: (1) as a hard mask during self-aligned etch (SAE) and during self-aligned-source etch; and (2) as a bottom anti-reflective layer for photolithography at second gate masking. In order for the silicon oxynitride to act as an adequate hard mask, it must be approximately 100 nm thick in current applications. However, the ideal BARC thickness is approximately 30 nm, which is not thick enough to survive the SAE and self-aligned source etching processes.

Thus, a 100 nm silicon oxynitride BARC is currently required and this causes line widths to be non-uniform. The non-uniform line width is a result of lensing reflections of light into the resist from undulations in the topography of reflective layers under the BARC that are not completely phase cancelled by the BARC.

A number of different solutions have been tried. None of these has been successful in producing the uniform line widths. Further, as the critical dimensions are reduced, the problem becomes more severe.

DISCLOSURE OF THE INVENTION

The present invention provides a bilayer ARC with optimized optical constants which can reduce the reflectivity from a reflective layer at a particular wavelength towards zero while, at the same time, being adequately thick to serve as a mask for etch.

The present invention provides a bilayer of silicon dioxide on top of silicon oxynitride for a reflective silicon substrate. Since the silicon dioxide is optically transparent at the DUV wavelength being used (248 nm), its thickness can be chosen to be adequately thick to serve as a hard mask for SAE and self-aligned-source etch and, at the same time, to satisfy the zero reflectivity requirement. It has been found that a silicon dioxide thickness of $t=x+m\lambda/2$, where x is the minimum thickness that will satisfy the zero reflectivity condition, $\lambda$ is the wavelength of light in the silicon dioxide, and m is an integer selected to achieve the desired layer thickness. The thickness of the silicon oxynitride layer is selected such that the reflectivity from the bilayer of silicon oxynitride and silicon dioxide is a minimum. The silicon dioxide thickness is chosen such that the combination of the silicon dioxide and silicon oxynitride thickness is adequate for being a good etch mask without increasing the reflectivity from the substrate 12.

The present invention provides a BARC which in practice reduces the reflections from the reflective layer by a factor of approximately 5 as compared with systems currently in use. In theory, as the manufacturing tolerances are better controlled, the reflections from the reflective layer can be reduced to zero.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
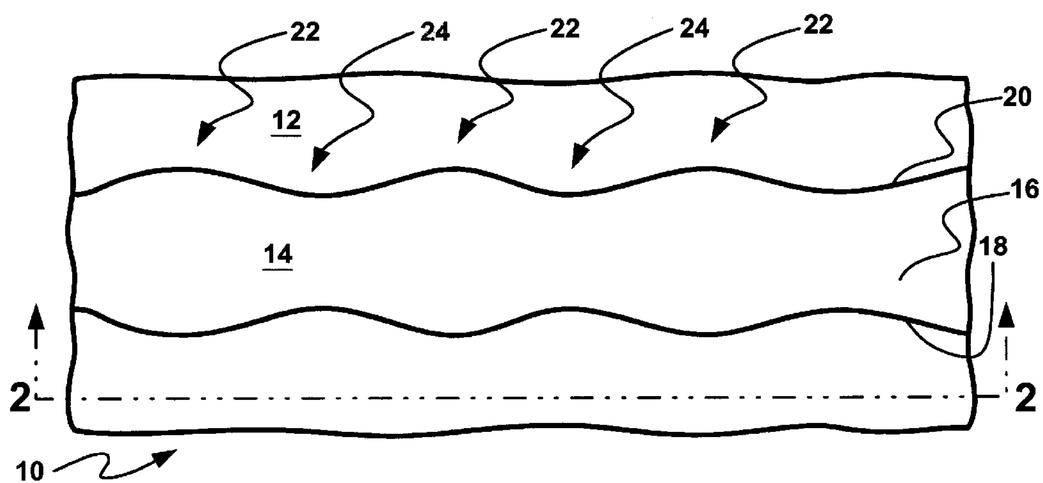
FIG. 1 (PRIOR ART) is a plan view of a portion of a semiconductor with a channel of developed resist disposed thereon.

Referring now to FIG. 1 (PRIOR ART), therein is shown a planned view of a portion of a semiconductor 10 having an undulating, partially reflective layer, or silicon substrate 12, and a patterned and developed resist 14, which may be a deep-ultraviolet (DUV) photolithography resist. The resist 14 has a top surface 16 and side surfaces 18 and 20. The resist line 14, rather than having a uniform width, has wider and narrower areas 22 and 24, respectively that correspond to high and low portions of a corrugated substrate topography.

Figure 2:
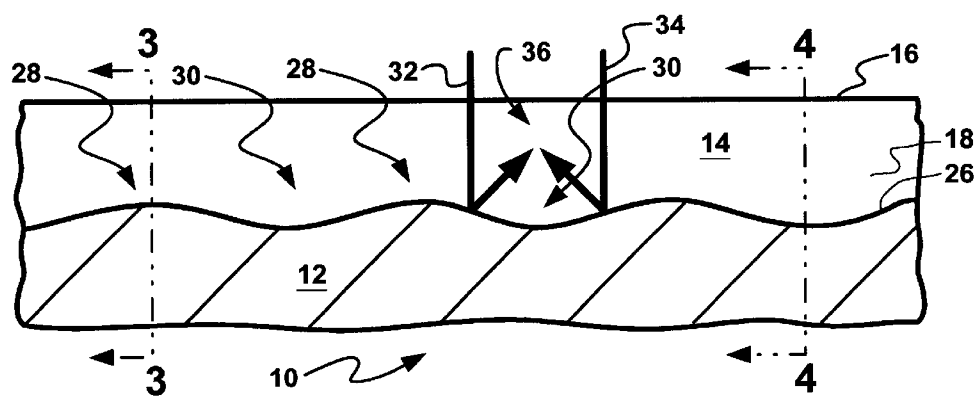
FIG. 2 (PRIOR ART) is a side view and cross-section of FIG. 1 along line 2—2.

Referring now to FIG. 2 (PRIOR ART), therein is shown the side view of the resist 14 with the side 18 and a cross-section of the substrate 12 which has a top surface 26 which is not truly flat. The top surface 26 has the corrugated substrate topography which has undulations as a result of manufacturing and processing. The substrate 12 has high and low regions 28 and 30, respectively. Between the high and low regions 28 and 30, DUV light, which is patterned on and through the resist 14 (before it is developed), is reflected, or lensed, toward certain areas of the resist 14. Light rays 32 and 34 are shown being reflected off the surface 26 of the substrate 12. The reflections of the light rays 32 and 34 are towards an area 36.

Figure 3:
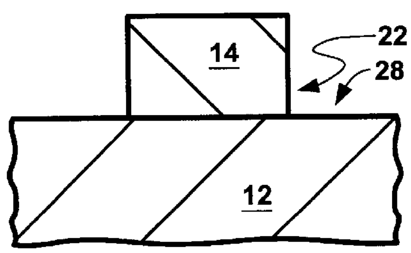
FIG. 3 (PRIOR ART) is a cross-section of FIG. 2 along line 3—3.

Referring now to FIG. 3 (PRIOR ART), therein is shown a cross-section of FIG. 2 along the line 3—3 which shows the wider areas 22 of the resist 14 over the high regions 28 of the substrate 12.

Figure 4:
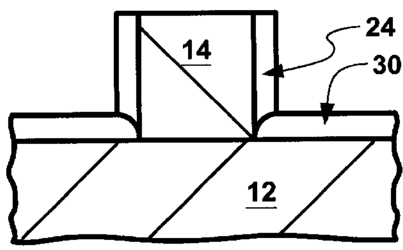
FIG. 4 (PRIOR ART) is a cross-section of FIG. 2 along line 4—4.

Referring now to FIG. 4 (PRIOR ART), therein is shown a cross-section of FIG. 2 taken along the line 4—4 showing the narrower areas 24 of the resist 14 and the lower regions 30 of the substrate 12.

Figure 5:
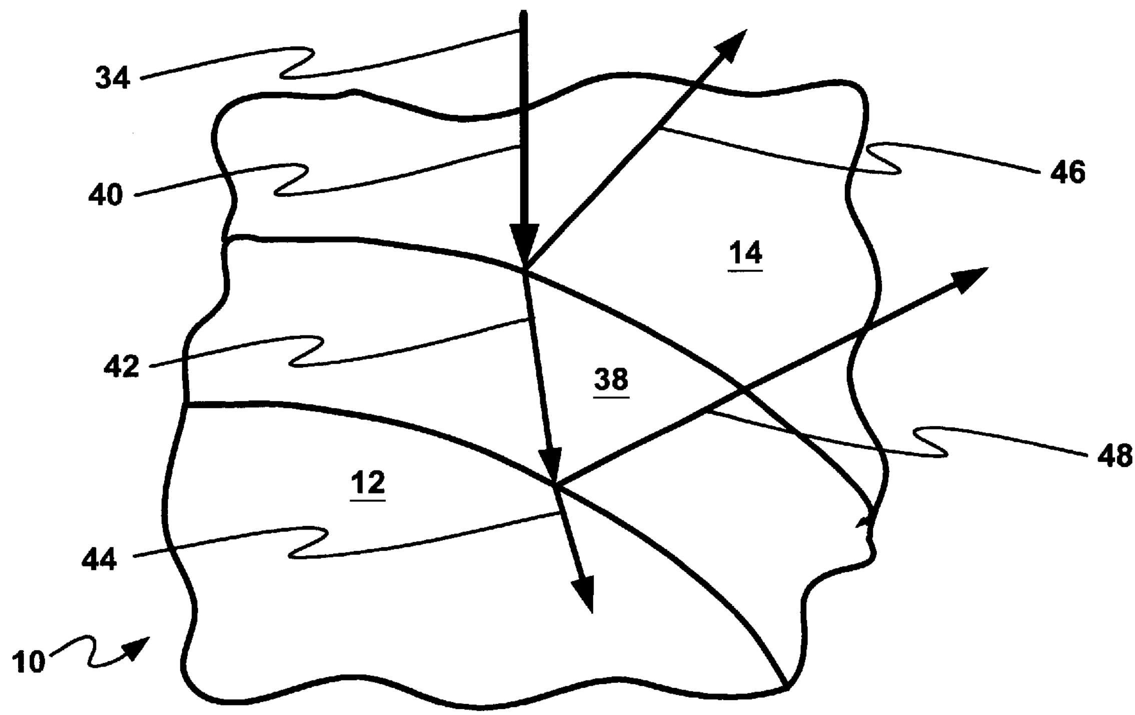
FIG. 5 (PRIOR ART) is a close-up cross-section of portion of the prior art BARC and the light rays therethrough.

Referring now to FIG. 5 (PRIOR ART), therein is shown a close up of the light ray 34 and a prior art BARC 38. The light ray 34 has a light ray 40 through the resist 14, a slightly refracted light ray 42 through the BARC 38 and a slightly refracted light ray 44 in the substrate 12, which is partially reflective and partially absorbing.

At the interface between the resist 14 and the BARC 38, there is a reflected light ray 46, and at the BARC 38 and substrate 12 interface there is a reflected light ray 48. In the past, the thickness of the BARC 38 was selected so as to cause the reflected light rays 46 and 48 to be out of phase. By being out of phase, the light rays will cancel, or destructively interfere, thus minimizing the amount of light that is reflected from the substrate 12 back into the resist. It should be noted that for one particular thickness, in this case ~30 nm, the reflectivity can be made to be essentially zero. But, if the BARC has to be made thicker than the desired minimum, while other local minimums in reflectivity can be found, no other thickness can be found that completely cancels the reflected light. This is because a significant portion of the light ray 42 is absorbed in the BARC 38, so the light ray 48 becomes weaker than the light ray 46.

Figure 6:
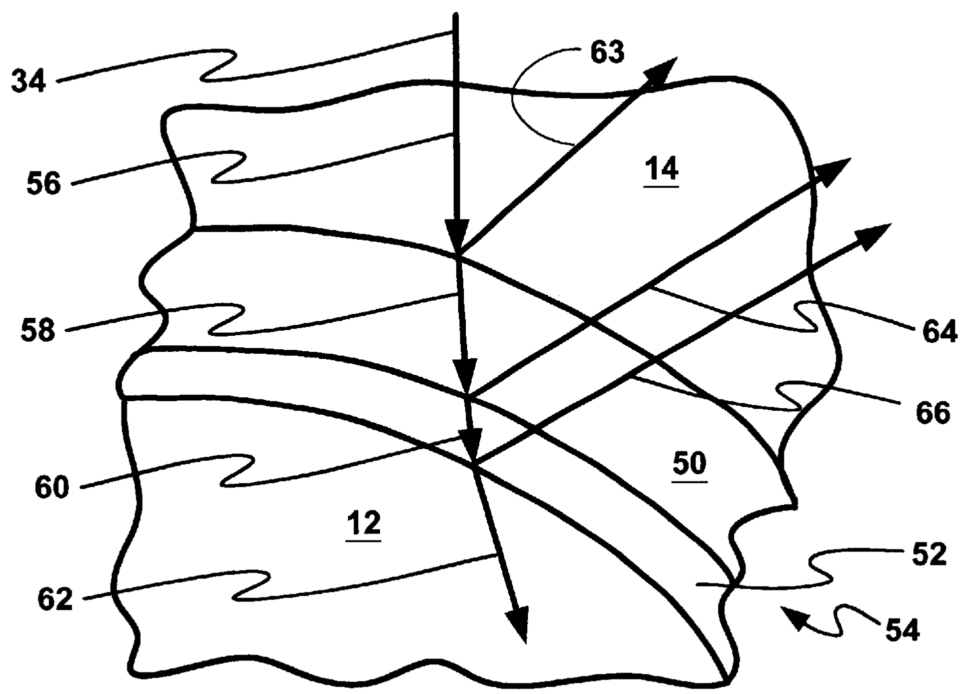
FIG. 6 is a close-up cross-section the BARC of the present invention and the light rays therethrough.

Referring now to FIG. 6, therein is a close-up cross section showing the light ray 34 and its reflections, and the two layers 50 and 52 of the BARC 54 of the present invention. The light ray 34 is shown having a light ray 56 through the resist 14, refracted light ray 58 through the first BARC layer 50, a refracted light ray 60 through the second BARC layer 52, and a refracted light ray 62 through the substrate 12. From the interface between the resist 14 and the first BARC layer 50, there is a reflected light ray 63. From the interface between the first and second BARC layers 50 and 52 is a reflected light ray 64, and between the second BARC layer 52 and the substrate 12 is a reflected light ray 66. Note that both FIG. 5 and FIG. 6 are somewhat simplified schematics that show only the incident and first ray reflected from each interface. For simplicity, other rays, such as the portions of exiting rays 46, 48, 63, 64, and 66 that are back-reflected toward the substrate 12 are not shown.

In the situation depicted in FIG. 5, in order to minimize reflectivity or to at least work at a local minimum in reflectivity, the BARC thickness is chosen such that ray 48 will cancel ray 46 as much as possible. In the situation depicted in FIG. 6, rays 66 and 64 are chosen such that their sum cancels ray 63.

In the manufacture of semiconductors, the conventional processing involves a very large number of steps and various layers of materials being deposited, photolithographically processed, and etched. At one point in the process, a resist 14 is deposited on the substrate 12. Using a mask (not shown) the resist 14 is patterned so as to allow DUV light to activate a portion of the resist 14 so as to make some volumes more susceptible to development than others.

FIG. 2 (PRIOR ART) shows the resist 14 and the substrate 12 after development. It is during this process of photo exposure that the light rays 32 and 34 will be reflected from the surface 26 between the high and low regions 28 and 30 to be more concentrated in the area 36. Because the resist 14 is sensitive to the amount of light energy received and absorbed by the resist 14, the subsequent development process will produce the narrow areas 24 in the resist 14 (seen in FIG. 1 (PRIOR ART)). It is well known to those skilled in the art that the required dose to properly expose the resist will vary with the thickness of the resist layer. This is commonly called the thin-film-interference effect and for a given resist would be described by a swing curve. In the example herein, the thin-film-interference effect is further exacerbated by the tendency of the concave portions of the underlying topography to focus the light into the resist above those areas as illustrated in FIG. 2. The resulting difference in the width of the resist 14 may best be seen by reference to FIG. 4 (PRIOR ART) which shows the width of the narrow areas 24 with the wider areas 22 in the back.

Attempts to compensate for the above phenomenon have resulted in the use of the BARC 38 shown in FIG. 5 (PRIOR ART) which is deposited on the substrate 12 before the deposition of the resist 14. The DUV light ray 34 enters the resist 14 and activates it. The light ray 34 further follows the light ray 40 until it reaches the boundary between the resist 14 and the BARC 38. At the boundary between the resist 14 and the BARC 38, a portion is refracted along the light ray 42 and a portion is reflected as light ray 46.

Light along the light ray 42 will partially be absorbed within the BARC 38 as it passes to the boundary between the BARC 38 and the substrate 12. At the boundary between the BARC 38 and the substrate 12, the light will be refracted along the light ray 44 and reflected as light ray 48. The light ray 48 is further attenuated by absorption by the BARC 38 after reflection.

It should be understood that the thickness of the BARC 38 must be an odd number of integral number of quarter-wavelengths thick in order to have the light reflected as light ray 48 be exactly out of phase with the light ray 46 so that the two reflective waves will optimally interfere by phase shift cancellation causing a local minimum in reflectivity. Although there may be several local minimums in reflectivity from the BARC as a function of BARC thickness, only the first minimum, which occurs for BARC thickness equal to one-quarter wavelength, will force the substrate 12 reflectivity to zero. In practice, for the case where a single layer is to serve as an etch hard-mask and as a BARC, the thickness of the BARC 38 must be much thicker than one-quarter wavelength so that the layer can survive etching and act as a hard mask for further etching of the substrate 12. In practice, for the particular application with a silicon oxynitride (SiON) BARC 38, the thickness should be approximately 30 nm, but this is too thin to be used as a hard mask during self-aligned etch and during self-aligned source etch. As a consequence, it is necessary to use a 100 nm thick layer. This thick layer causes severe attenuation along the light ray 48 and results in the wide and narrow areas 22 and 24 in the resist 14 (which, while better than in the prior art without the BARC 38, is still highly unsatisfactory).

In analyzing the problems, if two layers with the right optical constants could be used instead of one, then the thickness of each can be chosen so as to reduce the reflectivity from the substrate 12 at a particular wavelength to zero, and the bilayer can serve as the hard mask for etching.

In the case of the present invention as depicted in FIG. 6, the thickness of layers 50 and 52 are chosen such that reflected rays 64 and 66 act in concert to effectively cancel reflected light ray 63. The determination of optimal thickness of each layer must be calculated considering that two layers have three interfaces and the path lengths of the three reflections must be tuned to maximize the phase-shift cancellation effect.

One material which appeared to be worth investigating for the top layer 50 was silicon dioxide, $SiO_2$, since it is optically transparent at the actinic wavelength, or DUV wavelength of interest, which is 248 nm. The thickness of silicon dioxide could be chosen to satisfy the zero reflectivity condition at the same time to be adequately thick to serve as a good hard mask for etch. It was determined that the desired conditions could be obtained by choosing the $SiO_2$ thickness to be $t=x+m\lambda/2$, where x is the minimum thickness that will satisfy the zero reflectivity condition, $\lambda$ is the wavelength of light in the $SiO_2$, and m is an integer chosen to achieve the desired layer thickness.

In practice, the thickness of the two layers and the real and imaginary parts of the refractive index of the anti-reflective material, SiON, cannot be controlled with arbitrary precision. In simulations of the reflectivity from a bilayer of $SiO_2$ over SiON, the optical constants for the SiON and the thickness of the two layers are varied to reflect both the ideal case and the manufacturing control limits for thickness and layer composition. The simulations show that, on average, the bilayer should reduce the reflections from the reflective layer by a factor of approximately 5 as compared with the thick layer of SiON previously used. The total thickness of the bilayer will be of approximately the same thickness as the single layer of BARC previously used, and therefore, would be adequately thick for purposes of serving as a hard mask as before. Note that this is possible because the etch rates of the $SiO_2$ and SiON are approximately the same. However, if it happened that the $SiO_2$ had a higher etch rate than the SiON, then the $SiO_2$ layer thickness could be increased by $m\lambda/2$ to compensate for the increased etch rate while still maintaining the zero reflectivity condition.

Thus, the two layers will perform the two functions, as: (1) a hard mask during self-aligned etch (SAE) and during self-aligned-source etch; and (2) a bottom layer anti-reflective coating (BARC) for photolithography at second gate masking (2GM).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A bilayer anti-reflective coating and etch hard mask for a reflective layer comprising:

an anti-reflective material disposed on said reflective layer; and an etch-resistant material disposed on said anti-reflective material, said etch resistant material being substantially transparent at an actinic wavelength and thicker than the anti-reflective material whereby the reflectivity from said reflective layer at the actinic wavelength is reduced over the reflectivity from said reflective layer having said anti-reflective material alone.

2. The bilayer anti-reflective coating and etch hard mask as claimed in claim 1 wherein said anti-reflective material has a predetermined thickness proportional to the actinic wavelength.

3. The bilayer anti-reflective coating and etch hard mask as claimed in claim 1 wherein said anti-reflective material and said etch-resistant material are in a predetermined thickness ratio to reduce the reflectivity from said reflective layer at the actinic wavelength to zero.

4. The bilayer anti-reflective coating and etch hard mask as claimed in claim 1 wherein said etch-resistant material has a minimum thickness equal to $t=x+m\lambda/2$ where x is the minimum thickness for a zero reflectivity condition, $\lambda$ is the wavelength of actinic light in said etch-resistant material, and m is a predetermined integer used to achieve the desired layer thickness.

5. The bilayer anti-reflective coating and etch hard mask as claimed in claim 1 where said anti-reflective material is silicon oxynitride and said etch-resistant material is silicon dioxide.

6. The bilayer anti-reflective coating and etch hard mask as claimed in claim 1 wherein the etch rates of the etch-resistant material is higher than the etch rate of the anti-reflective material and the etch-resistant material thickness is $m\lambda/2$ thicker to compensate for the higher etch rate while still maintaining a zero reflectivity condition.

7. The bilayer anti-reflective coating and etch hard mask as claimed in claim 1 wherein the etch rates of the etch-resistant material is equal to the etch rate of the anti-reflective material.

* * * * *